United States Patent
Matsumoto

(10) Patent No.: US 7,302,668 B2
(45) Date of Patent: Nov. 27, 2007

(54) LAYOUT DESIGNING/CHARACTERISTIC ANALYZING APPARATUS FOR A WIRING BOARD

(75) Inventor: Takehide Matsumoto, Nara (JP)

(73) Assignee: Sharp Kabushiki Kaisha, Nagaike-cho, Abeno-ku, Osaka-shi, Osaka (JP)

( * ) Notice: Subject to any disclaimer, the term of this patent is extended or adjusted under 35 U.S.C. 154(b) by 168 days.

(21) Appl. No.: 11/165,088

(22) Filed: Jun. 22, 2005

(65) Prior Publication Data

US 2005/0289497 A1    Dec. 29, 2005

(30) Foreign Application Priority Data

Jun. 29, 2004    (JP)    ............... 2004-191505

(51) Int. Cl.
*G06F 17/50* (2006.01)
(52) U.S. Cl. ............................... 716/15; 716/4
(58) Field of Classification Search .......... 716/2, 716/4, 15
See application file for complete search history.

(56) References Cited

U.S. PATENT DOCUMENTS

| | | | | |
|---|---|---|---|---|
| 6,546,528 | B1 * | 4/2003 | Sasaki et al. ................ | 716/5 |
| 6,557,154 | B1 * | 4/2003 | Harada et al. ............... | 716/11 |
| 6,834,380 | B2 * | 12/2004 | Khazei ........................ | 716/10 |
| 2001/0018761 | A1 * | 8/2001 | Sasaki et al. ................ | 716/15 |
| 2002/0040466 | A1 * | 4/2002 | Khazei ........................ | 716/9 |
| 2002/0144228 | A1 * | 10/2002 | Uchida et al. .............. | 716/15 |

FOREIGN PATENT DOCUMENTS

| | | |
|---|---|---|
| JP | 06-325126 | 11/1994 |
| JP | 09-245076 | 9/1997 |
| JP | 10-319069 | 12/1998 |

* cited by examiner

*Primary Examiner*—Stacy A Whitmore
(74) *Attorney, Agent, or Firm*—Edwards Angell Palmer & Dodge LLP

(57) ABSTRACT

A layout designing/characteristic analyzing apparatus for a wiring board includes a module library memory for storing in advance for each of wiring board modules which are constituents of the wiring board, moduled circuit information on moduled circuits which constitute a wiring board circuit, wiring information and an analysis model for use in characteristic analysis; an input section for inputting instructions on connection of the moduled circuits so as to construct a desired circuit; a module coupling section for connecting moduled circuits based on the inputted instructions, for determining a layout of the wiring board based on the wiring information of each module and for generating a coupled analysis model in which the analysis models of the modules are coupled; a characteristic analyzing section for analyzing the characteristics of the wiring board based on the generated coupled analysis model; and an output section for outputting the determined layout and the results of the characteristic analysis of the wiring board.

13 Claims, 13 Drawing Sheets

Fig.4

Electromagnetic analysis model

| CURRENT DISTRIBUTION | | |
|---|---|---|
| POSITION | ANGLE | STRENGTH |
| 0 1 | 10 | 0.3 |
| 0 2 | 15 | 0.4 |
| 0 3 | 5 | 0.4 |
| . | . | . |
| . | . | . |
| . | . | . |

| RADIATION POINT A | | | |
|---|---|---|---|
| POSITION | 3 6 | | |
| PHASE | ANGLE | STRENGTH | |
| 0 | 0 0 | 5 | |
| 0 | 0 0.1 | 6 | |
| . | . | . | |
| . | . | . | |
| . | . | . | |

| RADIATION POINT B | | | |
|---|---|---|---|
| POSITION | 5 10 | | |
| PHASE | ANGLE | STRENGTH | |
| 0 | 0 0 | 2 | |
| 0 | 0 0.1 | 3 | |
| . | . | . | |
| . | . | . | |
| . | . | . | |

Fig. 8

Heat distribution analysis model

Simplification level 1

| NODE | NODE | | HEAT RESISTOR | | |
|---|---|---|---|---|---|
| | POSITION | HEAT QUANTITY | NODE | NODE | RESISTANCE |
| a | 0 3 | 0 | a | a | 5 |
| b | 0 6 | 15 | a | b | 10 |
| c | 0 9 | 5 | a | c | 12 |
| ... | ... | ... | ... | ... | ... |

Simplification level n

| NODE | NODE | | HEAT RESISTOR | | |
|---|---|---|---|---|---|
| | POSITION | HEAT QUANTITY | NODE | NODE | RESISTANCE |
| a | 12 12 | 0 | a | OUTSIDE(N) | 5 |
| | | | a | OUTSIDE(E) | 7 |
| | | | a | OUTSIDE(S) | 7 |
| | | | ... | ... | ... |

LAYOUT DESIGNING/CHARACTERISTIC ANALYZING APPARATUS FOR A WIRING BOARD

CROSS-REFERENCE TO RELATED APPLICATION

This application is related to Japanese application No. 2004-191505 filed on Jun. 29, 2004, whose priority is claimed under 35 USC §119, the disclosure of which is incorporated by reference in its entirety.

BACKGROUND OF THE INVENTION

1. Field of the Invention

The present invention relates to a layout designing/characteristic analyzing apparatus for designing a layout of a wiring board, and specifically to a layout designing/characteristic analyzing apparatus for a wiring board which analyzes the characteristics of a wiring board immediately after designing of a layout to obtain the results.

2. Description of Related Art

As the operation frequency of electronic circuits increases, causing the voltages to decrease for reduction in power consumption of the circuits, and as the packing density of the electronic circuits increases for miniaturization, measures against heat associated with the radiation and power consumption of electronic hardware are becoming important. Conventionally, it has been common to make prototype circuits to evaluate the effect of the measures. However, with the problems becoming increasingly difficult due to the above changes, there have been cases where many prototypes need to be repeatedly formed until an optimal solution is obtained. For this reason, an improvement in circuit developing techniques in terms of both development speed and cost has been desired.

Under such circumstances, a technique has been adopted which analyzes the radiation characteristics and heat distributions of a wiring board using a simulation tool to help solving the problems at the step before the preparation of a prototype wiring board There is known, for example, a layout designing/characteristic analyzing apparatus which includes a plurality of simulators such as a waveform simulator, timing simulator, heat simulator, EMC simulator and the like. This apparatus uses the analysis results obtained from these simulators for designing wiring boards (see, for example, Japanese Unexamined Patent Publication No. HEI 9(1997)-245076).

However, in EMC analysis, for example, a three-dimensional structure of a wiring board is formalized into a model and the current distributions in the board generated by circuit applied voltages are numerically expressed as integral equations so that their solutions can be determined using numerical integral calculus such as a moment method. Elemental currents that represent each of the obtained current distributions are superimposed to determine elemental currents inside the board. Then, based on each of the determined elemental currents, the electromagnetic field at each point is analyzed. According to the above-mentioned moment method, the integral equations are converted into linear equations and solved so that approximate solutions of the elemental currents representing the current distributions can be obtained. However, since the amount of calculation is enormous, it requires a great amount of time for computations. Heat analysis also takes a considerable amount of time for analysis, though not as much as the EMC analysis. For this reason, various analysis results can not immediately be obtained after the designing of a wiring board layout, and a layout designing/characteristic analyzing apparatus that can acquire the analysis results in a short time has been desired.

With respect to such a problem, there has been proposed means such as improvement in algorithm and adoption of a high-speed, large-size computer (see, for example, Japanese Unexamined Patent Publication No. HEI 10(1998)-319069). However, the former of the two means has not yet achieved an analysis time suitable for practical use and the latter has a problem in cost for achieving an analysis time suitable for practical use.

On the other hand, there has been known a technique of dividing a wiring board into modules to convert them into a library and using these modules which are compiled into the library to design interconnections on the wiring board (see, for example, Japanese Unexamined Patent Publication No. HEI 06(1994)-325126).

As the technology of designing by module formation advances as described above, the number of components on a wiring board increases while the time provided for the interconnection design is reduced. This complicates generation of an analysis model and analysis after layout designing of a wiring board, which makes an enormous amount of time to be taken for obtaining analysis results. Because of this, the difference widens between the time required for interconnection designing and the time required for analysis, meaning that most of the development period would be spent on the analysis if the current circumstances do not change.

There is also a method of simplifying models to reduce the time required for analysis. However, because the effect of simplification on analysis accuracy can not be simply estimated, the simplification of models not only requires time for preparing simplified models but also requires advanced knowledge.

SUMMARY OF THE INVENTION

In one aspect, the present invention provides, in order to solve the aforementioned problems, a layout designing/characteristic analyzing apparatus for a wiring board which, by preparing in advance electromagnetic field analysis models and/or heat distribution analysis models corresponding to wiring board modules which are compiled into a library, reduces the analysis amount at interconnection designing so that the radiation characteristics and heat distribution analysis results are obtained immediately after a designer designs a wiring board layout using the wiring board modules, whereby a wiring board layout can be efficiently designed.

In accordance with the present invention, there is provided a layout designing/characteristic analyzing apparatus for a wiring board, the apparatus comprising: a module library memory for storing in advance for each of wiring board modules which are constituents of the wiring board, moduled circuit information on moduled circuits which constitute a wiring board circuit, wiring information and an analysis model for use in characteristic analysis; an input section for inputting instructions on connection of the moduled circuits so as to construct a desired circuit; a module coupling section for connecting moduled circuits based on the inputted instructions, for determining a layout of the wiring board based on the wiring information of each module and for generating a coupled analysis model in which the analysis models of the modules are coupled; a characteristic analyzing section for analyzing the characteristics of the wiring board based on the generated coupled analysis model; and an output section for outputting the determined layout and the results of the characteristic analysis of the wiring board.

The layout designing/characteristic analyzing apparatus for a wiring board of the present invention includes the module library memory that stores in advance for each wiring board module, the moduled circuit information on moduled circuits which constitute a wiring board circuit, the wiring information about on-board components and an analysis model for use in characteristic analysis, and is constructed to connect the analysis models of the modules to be coupled to generate the coupled analysis model. Thus, the analysis models which are provided for the respective modules and stored in advance are used so that the characteristic analysis of a layout can be performed in a shorter period of time than in conventional cases. The designer can correct interconnections based on the obtained analysis results and evaluate the corrected interconnections promptly, thereby being able to sufficiently evaluate in a limited design period whether or not the characteristics related to the interconnection design meet target design standards. Hence, products with excellent quality and high reliability can be made.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIG. 4 is an explanatory view illustrating one example of a data table that stores electromagnetic field analysis models of the present invention as numerical data;

FIG. 6 is an explanatory view illustrating how a electromagnetic field analysis model 14*a* of the present invention is influenced by being electromagnetically coupled with electromagnetic field analysis models 14*b*, 14*c* . . . and so on;

FIG. 8 is an explanatory view illustrating one example of a data table that stores heat distribution analysis models of the present invention as numerical data;

DESCRIPTION OF THE PREFERRED EMBODIMENTS

Figure 1:
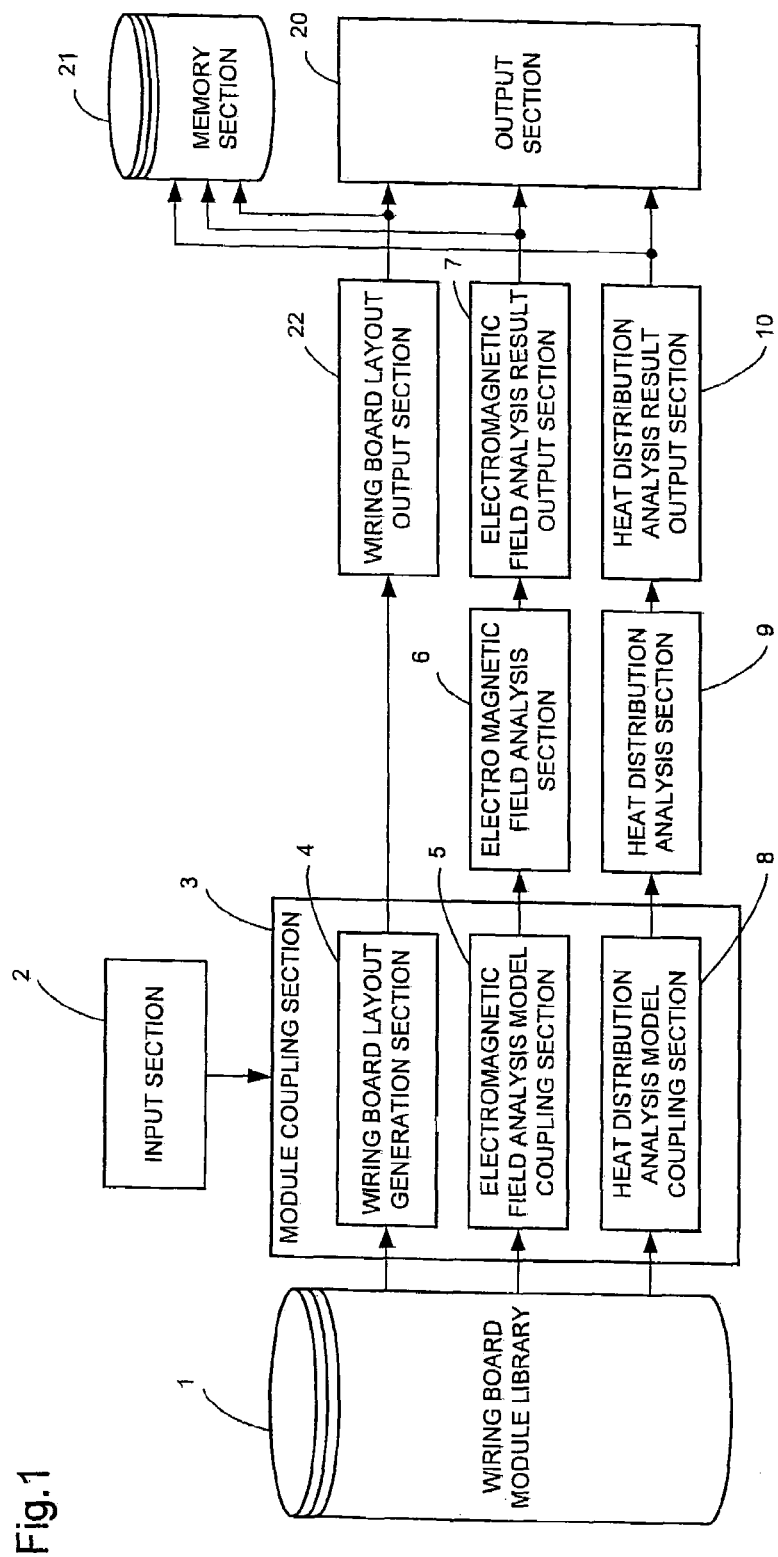
FIG. 1 is a block diagram illustrating the constitution of a layout designing/characteristic analyzing apparatus for a wiring board, according to an embodiment of the present invention, for designing/evaluation of a wiring board layout using modules which are compiled into a library.

A layout designing/characteristic analyzing apparatus for a wiring board of the present invention includes: a module library memory for storing in advance for each of wiring board modules which are constituents of the wiring board, moduled circuit information on moduled circuits which constitute a wiring board circuit, wiring information and an analysis model for use in characteristic analysis; an input section for inputting instructions on connection of the moduled circuits so as to construct a desired circuit; a module coupling section for connecting moduled circuits based on the inputted instructions, for determining a layout of the wiring board based on the wiring information of each module and for generating a coupled analysis model in which the analysis models of the modules are coupled; a characteristic analyzing section for analyzing the characteristics of the wiring board based on the generated coupled analysis model; and an output section for outputting the determined layout and the results of the characteristic analysis of the wiring board.

Here, the wiring board modules are regions that constitute the wiring board. The modules may be, for example, regions each including an on-board component and an area surrounding it. Alternatively, each unit module may be a region defined as a circuit having a plurality of components combined to achieve a predetermined function. By the moduled circuit information is meant information indicating whether a coupling node connected to the outside of the module is input or output, and information on the electrical characteristics of the module such as signal voltage level. By the wiring information is meant information indicating, for example, which component is mounted on which position of the module and information on to which terminal of the components each interconnection of the module is connected. The component information is the electrical and mechanical characteristics of the components mounted on the circuit and it includes, for example, the content of a signal and rating of each terminal of the components. The analysis model is a representation of the characteristics of the wiring board module in a desired form made at the time of characteristic analysis. Examples of the analysis model are given in the embodiments described below of the present specification.

The layout of the wiring board is, for example, information on the physical position of interconnection pattern formed on the wiring board and information on terminals connected to the interconnections and on the connection with the interconnections.

The apparatus of the present invention may be constructed so that: the module library memory stores an electromagnetic field analysis model as the analysis model; the module coupling section outputs a coupled electromagnetic field analysis model as the coupled analysis model; and the characteristic analyzing section performs electromagnetic field analysis based on the coupled electromagnetic field analysis model. With this construction, the analysis of electromagnetic field characteristics which greatly depend on the wiring board layout can be efficiently performed, allowing it be possible to sufficiently evaluate whether or not the electromagnetic field characteristics related to the wiring board design meet target standards at the design stage. Hence, products with excellent quality and high reliability can be made. Here, the electromagnetic field analysis is intended, for example, to check that there is no fear of an on-board component malfunctioning in response to the effect of being electromagnetically coupled with other components or currents that flow in the circuit, or to evaluate the effect that electromagnetic fields, which are emitted from the wiring board, exert on the outside of the wiring board.

The electromagnetic field analysis model may include either one or both of a current distribution model represented by elemental currents in divided regions of each module and a radiation point model represented by points of imaginary radiation sources located on each module. With this construction, the electromagnetic field analysis model includes at least one of the current distribution model that obtains particularly accurate analysis results in near regions and the radiation point model that achieves sufficient accuracy with respect to radiation sources in far regions with less calculation amount than the current distribution model.

The present invention further provides a layout designing/characteristic analyzing apparatus for a wiring board, the apparatus comprising: module library memory for storing in advance for each of wiring board modules which are constituents of the wiring board, moduled circuit information on moduled circuits which constitute a wiring board circuit, wiring information and an electromagnetic field analysis model, the electromagnetic field analysis model including either one of or both of a current distribution model represented by elemental currents in divided regions of each module and a radiation point model represented by points of imaginary radiation sources located in each module; an input section for inputting instructions on connection of the moduled circuits so as to construct a desired circuit; a module coupling section for connecting the moduled circuits based on the inputted instructions, for determining a layout of the wiring board based on the wiring information of each module and for generating a coupled electromagnetic field analysis model in which the field analysis models of the modules are coupled; a characteristic analyzing section for analyzing the electromagnetic field characteristics of the wiring board based on the generated coupled electromagnetic field analysis model; and an output section for outputting the determined layout and the results of the electromagnetic field characteristic analysis of the wiring board.

According to the invention, the determination of the layout on the basis of the wiring information of each module and the generation of the coupled electromagnetic field analysis model on the basis of the electromagnetic field analysis model of each module can be performed collectively, rendering the operations be carried out efficiently. Furthermore, since a coupled characteristic analysis model for the characteristic analysis can be obtained at the same time as the layout determination, the characteristic analysis can be done promptly.

The characteristic analyzing section may be constructed so as to calculate the strength of an electromagnetic field that an observation point receives from each module based on the electromagnetic field analysis model and combine the calculated strengths of electromagnetic fields to determine the strength of electromagnetic fields that the observation point receives from the wiring board. Furthermore, the characteristic analyzing section may be constructed so as to determine the strength of electromagnetic fields that the observation point receives from the wiring board based on the result of calculation of electromagnetic fields in predetermined coupled modules using the radiation point model and the result of calculation of electromagnetic fields in other predetermined coupled modules using the current distribution model. With this construction, the strengths of electromagnetic fields incident on the observation point are determined using the radiation point model which requires less calculation amount, and the calculation using the current distribution model which achieves more accurate analysis results is performed only in the near regions. Thus, analysis with both fast calculation and high accuracy can be realized.

The module library memory may be constructed to store a heat distribution analysis model as the analysis model and the module coupling section may be constructed to output a coupled heat distribution analysis model as the coupled analysis model. Furthermore, the characteristic analyzing section may be constructed to perform heat distribution characteristic analysis based on the coupled heat distribution analysis model. With this construction, the analysis of heat distribution characteristics which greatly depend on the wiring board layout can be efficiently performed, allowing it be possible to sufficiently evaluate whether or not the heat distribution characteristics related to the wiring board design meet target standards at the design stage. Hence, products with excellent quality and high reliability can be produced.

Here, by the heat distribution analysis is meant analysis to evaluate how much thermal effect, that is, temperature raise the heat caused by the operation of on-board circuit elements have on each point on the wiring board.

The heat distribution analysis model may comprise an equivalent network having a plurality of nodes, a heat source having a predetermined heat quantity connected to one of the nodes and a plurality of heat resistors each having a predetermined resistance connected between the nodes. Furthermore, the heat distribution analysis model may include a plurality of heat distribution analysis models different in simplification level from one another. Since the heat distribution analysis model includes the plurality of heat distribution analysis models different in simplification level from one another, an optimal balance between calculation amount and accuracy can be attained depending on the purpose, and the processing speed and analysis accuracy can be compatible with each other.

The present invention further provides a layout designing/characteristic analyzing apparatus for a wiring board, the apparatus comprising: a module library memory for storing in advance for each of wiring board modules which are constituents of the wiring board, moduled circuit information on moduled circuits which constitute a wiring board circuit, wiring information and a heat distribution analysis model, the heat distribution analysis model comprising an equivalent network having a plurality of nodes, a heat source having a predetermined heat quantity connected to one of the nodes and a plurality of heat resistors each having a predetermined resistance connected between the nodes; an input section for inputting instructions on connection of the moduled circuits so as to construct a desired circuit; a module coupling section for connecting the moduled circuits based on the inputted instructions, for determining a layout of the wiring board based on the wiring information of each module and for generating a coupled heat distribution analysis model in which the heat distribution analysis models of the modules are coupled; a characteristic analyzing section for analyzing the heat distribution characteristics of the laid-out wiring board based on the generated coupled heat distribution analysis model; and an output section for outputting the determined layout and the results of the heat distribution characteristic analysis of the wiring board.

According to the invention, the determination of the layout on the basis of the wiring information of each module and the generation of the coupled heat distribution analysis model on the basis of the heat distribution analysis model of each module can be performed collectively, rendering the operations be carried out efficiently. Furthermore, since the coupled characteristic analysis model for characteristic analysis can be obtained at the same time as the layout determination, the characteristic analysis can be done promptly.

The module coupling section may be constructed to couple the heat distribution analysis models which are different in simplification level from one module to another to form a thermal equivalent circuit. With this construction, analysis can be done using a detailed heat distribution analysis model for the modules near a target point and a simplified heat distribution analysis model for the modules distant from the target point, whereby analysis with both fast calculation speed and high accuracy can be realized.

The characteristic analyzing section may be constructed to calculate the thermal effects that an observation point receives from the respective modules and combines these effects to determine the thermal effect that the observation point receives from the wiring board. Furthermore, the characteristic analyzing section may be constructed to determine the thermal effect that the observation point receives from the wiring board based on the result of calculation of the thermal effect that the observation point receives from the wiring board using the coupled heat distribution analysis model in which the heat distribution analysis models at a predetermined simplification level are coupled and the result of calculation of the thermal effect in predetermined coupled modules using the heat distribution analysis model at a lower simplification level.

With this construction, the analysis can be performed using the detailed heat distribution analysis model for the modules near the target point and the simplified heat distribution analysis model for the modules distant from the target point, whereby analysis with both fast calculation speed and high accuracy can be realized.

Referring now to the drawings, a layout designing/characteristic analyzing apparatus for a wiring board according to the present invention will be described below in greater detail.

FIG. 1 is a block diagram illustrating the constitution of the layout designing/characteristic analyzing apparatus for a wiring board, in accordance with the present invention, for designing/evaluation of a wiring board layout using modules that are compiled into a library. A wiring board module library 1 shown in FIG. 1 is a memory having stored therein, moduled circuit information on the electrical characteristics of each of moduled circuits which constitute a circuit and wiring information on the connection and position of components mounted on the wiring board for each of wiring board modules that are used for designing, and component information on the electrical and mechanical characteristics of each of the mounted components. The module library 1 also has an electromagnetic field analysis model and a heat-distribution model stored in advance for each module.

Figure 2:
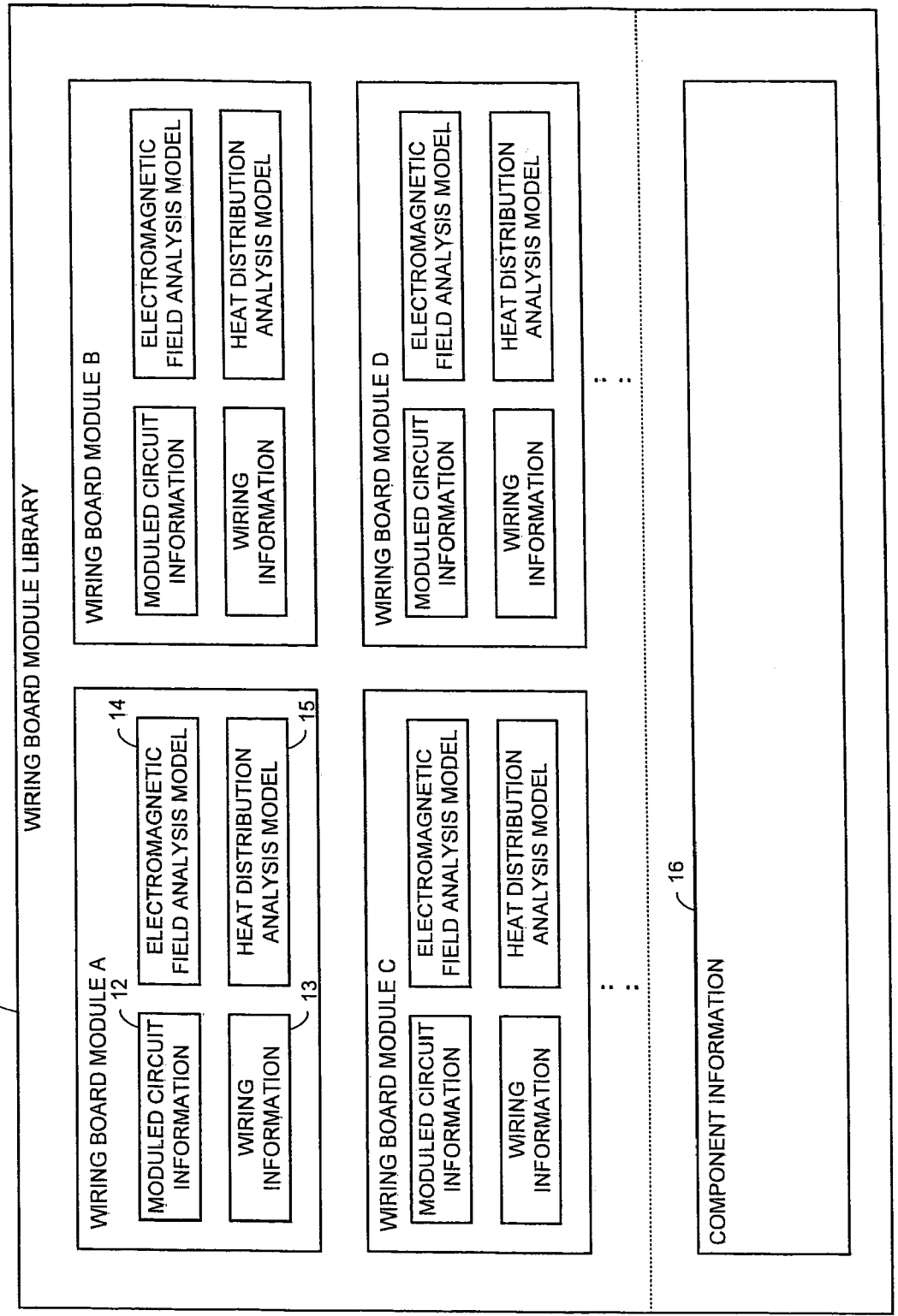
FIG. 2 is a block diagram illustrating the internal configuration of a module library 1 of FIG. 1.

FIG. 2 is a block diagram illustrating the configuration of data stored in the module library 1 of FIG. 1. The module library 1 includes a plurality of wiring board modules 11. Each module 11 includes moduled circuit information 12, wiring information 13, an electromagnetic field analysis model 14 and a heat distribution analysis model 15 which are compiled into a library for each module and component information 16.

The moduled circuit information 12 indicates information on the moduled circuit of module 11 and a designer of a wiring board layout refers to this information at an input section 2 for designing. The wiring information 13 indicates information on mounting of a component such as a component used in each of the modules 11 and the position of the component. This information is consulted by the designer at the input section 2 and is also used for generation of a wiring board layout at a wiring board layout generation section 4 in a module coupling section 3. The electromagnetic field analysis model 14 is a model that is adapted independently for each of the modules for use in electromagnetic field analysis. One example of the electromagnetic field analysis model is a current distribution in the wiring board. This current distribution is obtained by: formulating integral equations each numerically expressing a distribution of currents in the wiring board generated by an applied voltage to the circuit of the wiring board; acquiring elemental currents representing each current distribution using a moment method, and superimposing the acquired elemental currents for each applied voltage. Another example of the electromagnetic field analysis model is a model of imaginary radiation points provided on the modules based on the current distributions obtained in such a manner as described above. The radiation point model is lower in approximation accuracy than the current distribution model, but is simpler in processing for analysis. The imaginary radiation points will hereinafter be referred to as the radiation points.

The heat distribution analysis model 15 is a model adapted independently for each module for use in heat distribution analysis. One example of the heat distribution analysis model is an equivalent network constituted of a heat source connected to one of nodes and a plurality of heat resistors connected between the nodes. According to the present invention, since each module 11 includes the reusable electromagnetic field analysis model 14 and heat distribution analysis model 15 which are calculated in advance, the analysis can be performed using, at the electromagnetic field analysis or the heat-distribution analysis, the data of these models which are prepared in advance for each module. This allows the results of the field or heat-distribution analysis to be obtained in a shorter time than the conventional cases.

The component information 16 stores information on all of the components used in the modules 11. The moduled circuit information 12 and the wiring information 13 of each module 11 include information on the component used in the module. The component information 16 is consulted for the characteristics of each component.

The input section 2 shown in FIG. 1 is, for example, an input means such as a keyboard, a mouse or the like. The designer of the wiring board layout uses such means to input information necessary for the layout designing (such as selection information on which module is used, module connection information, operating conditions of each module and the like).

The module coupling section 3 executes coupling of the modules based on the information inputted from the input section 2. The wiring board layout generation section 4 generates wiring board layout data based on the moduled circuit information 12 and wiring information 13 of each of the modules that are coupled. The layout data generated by the generation section 4 is converted into data in outputtable form at a wiring board layout output section 22 to be outputted to an output section 20. Since such a series of operations for determining the wiring board layout is carried out in conventional layout designing/characteristic analyzing apparatuses as well, a further description on the details of the operations will be omitted. The module coupling section 3 and the layout output section 22 can be realized using, for example, a computer and a storage device such as a ROM or a hard disk having a computer-readable program stored therein, or a RAM.

The output section 20 is, for example, a display means such as a CRT or a liquid-crystal display, or it may be a printing means such as a printer or the like. The data in the layout output section 22 is stored in a memory 21 upon necessity.

The memory 21 is, for example, a storage device such as a hard disk, or it may be a magneto-optical disk storage device. Where the memory 21 is the hard disk, it may be constructed such that the same hard disk is shared with the module library 1.

The module coupling section 3 further includes an electromagnetic field analysis model coupling section 5 and a heat distribution analysis model coupling section 8. The electromagnetic field analysis model coupling section 5 executes coupling of the electromagnetic field analysis models 14 of the respective modules 11 based on the information inputted from the input section 2 to generate a coupled electromagnetic field analysis model of the entire wiring board. An electromagnetic field analysis section 6 executes electromagnetic field analysis using the coupled electromagnetic field analysis model. The electromagnetic field analysis section 6 can be realized using, for example, a computer and a storage device such as a ROM or a hard disk having a computer-readable program stored therein, or a RAM. The results obtained from the electromagnetic field analysis are sent to an electromagnetic field analysis result output section 7 to be converted into outputtable data and then outputted to the output section 20.

The heat-distribution analysis model coupling section 8 executes coupling of heat distribution analysis models 15 based on the information inputted from the input section 2 to generate a coupled heat distribution analysis model of the entire wiring board. A heat distribution analysis section 9 executes heat distribution characteristic analysis using the coupled heat-distribution analysis model. The heat-distribution analysis section 9 can be realized using, for example, a computer and a storage device such as a ROM or a hard disk having a computer-readable program stored therein, or a RAM. The results obtained from the heat distribution characteristic analysis are sent to a heat distribution analysis result output section 10 to be converted into outputtable data and then outputted to the output section 20.

The designer of the wiring board layout refers to the results of the electromagnetic field characteristic analysis or the heat distribution characteristic analysis, and reconsiders the layout design if the analysis results do not satisfy target standards. Based on the reconsidered layout design, the designer inputs again the module connection information and the like from the input section 2. Thus, the layout designing and the analyses are repeated.

The electromagnetic field analysis model 14 will be described below in greater detail and an explanation will be given on the flow of procedures from the generation of the coupled electromagnetic field analysis model, in which electromagnetic field analysis models 14 are coupled, to the obtainment of the results of electromagnetic field analysis based on the generated analysis model.

Figure 3A:
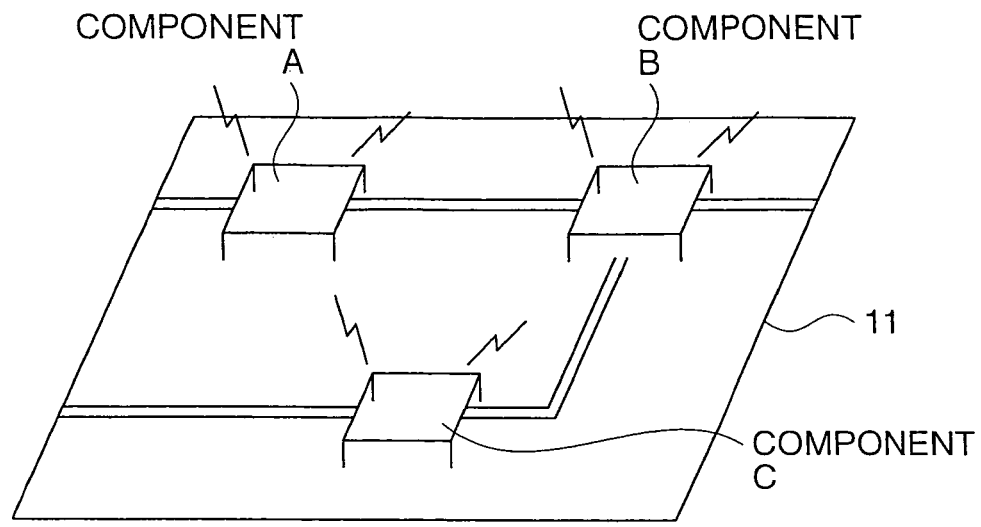
FIG. 3A is an explanatory view of components mounted on a wiring board module 11 of FIG. 2, and FIGS. 3B and 3C are explanatory views of electromagnetic field analysis models 14 corresponding to the module 11, respectively.
Figure 3B:
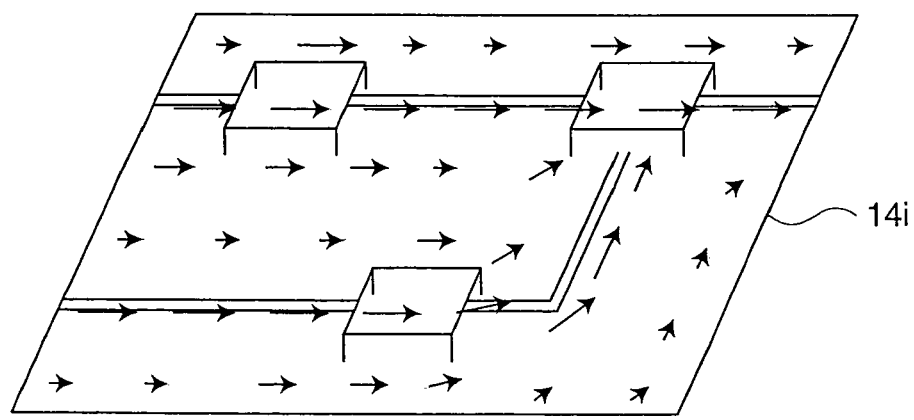
Figure 3C:
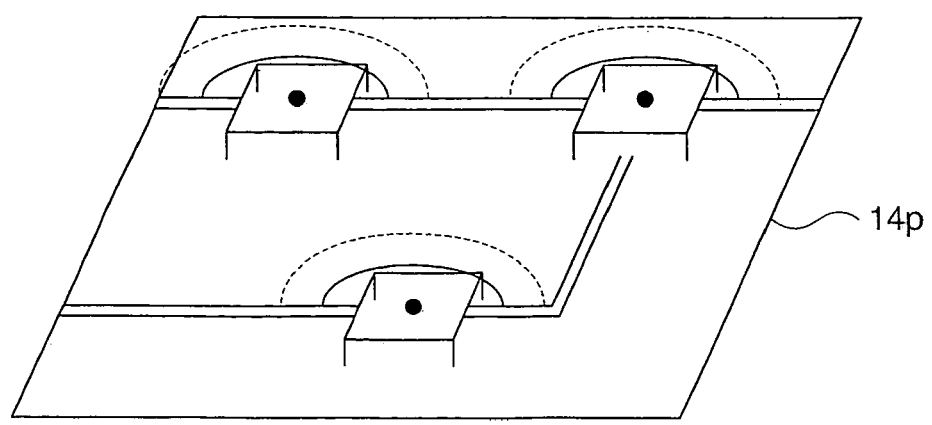

FIG. 3A is an explanatory view illustrating the components mounted on the module 11 and FIGS. 3B and 3C are explanatory views of the electromagnetic field analysis models 14 corresponding to the module 11, respectively. FIG. 3A shows the layout pattern and the on-board components of the module 11. Each of the electromagnetic field analysis models 14 is generated in accordance with the wiring information 13 of the module 11 in cut out state as shown in the figure and the component information 16 of the mounted components.

FIG. 3B illustrates the current distribution model in which shown are elemental currents on the wiring board when a current flows in the module 11 and a circuit is actually operating. The elemental currents in the module 11 is precalculated and stored as the electromagnetic field analysis model 14 in the module library 1 for each module.

FIG. 3C illustrates the radiation point model. The radiation point model is an example of the electromagnetic field analysis model 14 and is a model in which imaginary radiation points are located on points where the radiation amount is particularly large so that the radiation from the wiring board is represented in the form of radiation from each of the radiation points. Each radiation point has its own directivity as the radiation characteristics. Analysis using the radiation point model is poor in analysis accuracy and its analysis results differ greatly from the actual measurement values when electromagnetic fields in near regions are determined, but is adequate for obtaining approximations in far regions. Where an adequate analysis accuracy can not be achieved with the radiation point model using radiation points, the current distribution model may be used.

FIG. 4 is an explanatory view illustrating one example of a data table that stores the electromagnetic field analysis models as numerical data. FIG. 4 illustrates the example in which two types of electromagnetic field analysis models, that is, the current distribution and radiation point models, are stored respectively as numerical data tables. In the current distribution model, each module is divided into smaller regions and the positions of the divided regions, the angles from the reference direction of the currents (indicating the directions of the currents) and the strengths of the currents are stored as data. In the radiation point model, the positions of the imaginary radiation points located on the module and the strengths of the electromagnetic fields with respect to the angles of the respective radiation points from the reference direction (i.e. indicating certain angles) are stored as data. The data table may store phase factors as will be described later. The table shown in FIG. 4 is one exemplary representation of the electromagnetic field analysis model. The representation of the model should not be limited thereto and it may be in the form of numerical formulas.

The values of the current distribution model shown in FIG. 4 are obtained, for example, as follows. First, main circuit applied voltages in the module are estimated and current distributions in regions of the module generated by the applied voltages are numerically expressed as integral equations. Then, using the numerical integral calculus such as the moment method or the like, solutions of the equations are obtained as elemental currents. The obtained elemental currents for the respective applied voltages are superimposed so that each elemental current in the module is obtained. The radiation point model is obtained by determining the position, magnitude and directivity of imaginary radiation points from the current distribution model to obtain an approximate model. The amount of computations required for such formation of models is usually enormous and time is required for these computations. In the present invention, however, the computations are performed in advance for each module 11 and results of the computations are stored in reusable form, so that the time required for analyzing the modules at the layout designing is significantly reduced. Furthermore, since the simplification of the optimal models can be done in advance, the need for considering, every time a layout is designed, the simplification of the models for the obtainment of suitable analysis results is eliminated, and a user is not required to have advanced knowledge.

The electromagnetic field analysis model 14 includes, on the assumption that the environment (the magnitude of current/voltage and the like) in which the modules 11 are used changes depending upon the layout, a plurality of elemental currents and radiation characteristics that correspond to the use environment. The layout designer decides the conditions under which the modules are used and adopts the electromagnetic field analysis model corresponding to the conditions. Such selection of the conditions may include selection of the type of electromagnetic field analysis model, that is, selection between the current distribution model and the radiation point model. The electromagnetic field analysis is performed based on the characteristics of the selected electromagnetic field analysis model.

Connecting of the electromagnetic field analysis models 14 are handled at the electromagnetic field analysis model coupling section 5. Since the connecting of the models is in accordance with the module coupling at the layout generation section 4, the module coupling section 3 can generate the coupled electromagnetic field analysis model at the same time as the generation of the wiring board layout.

Figure 5:
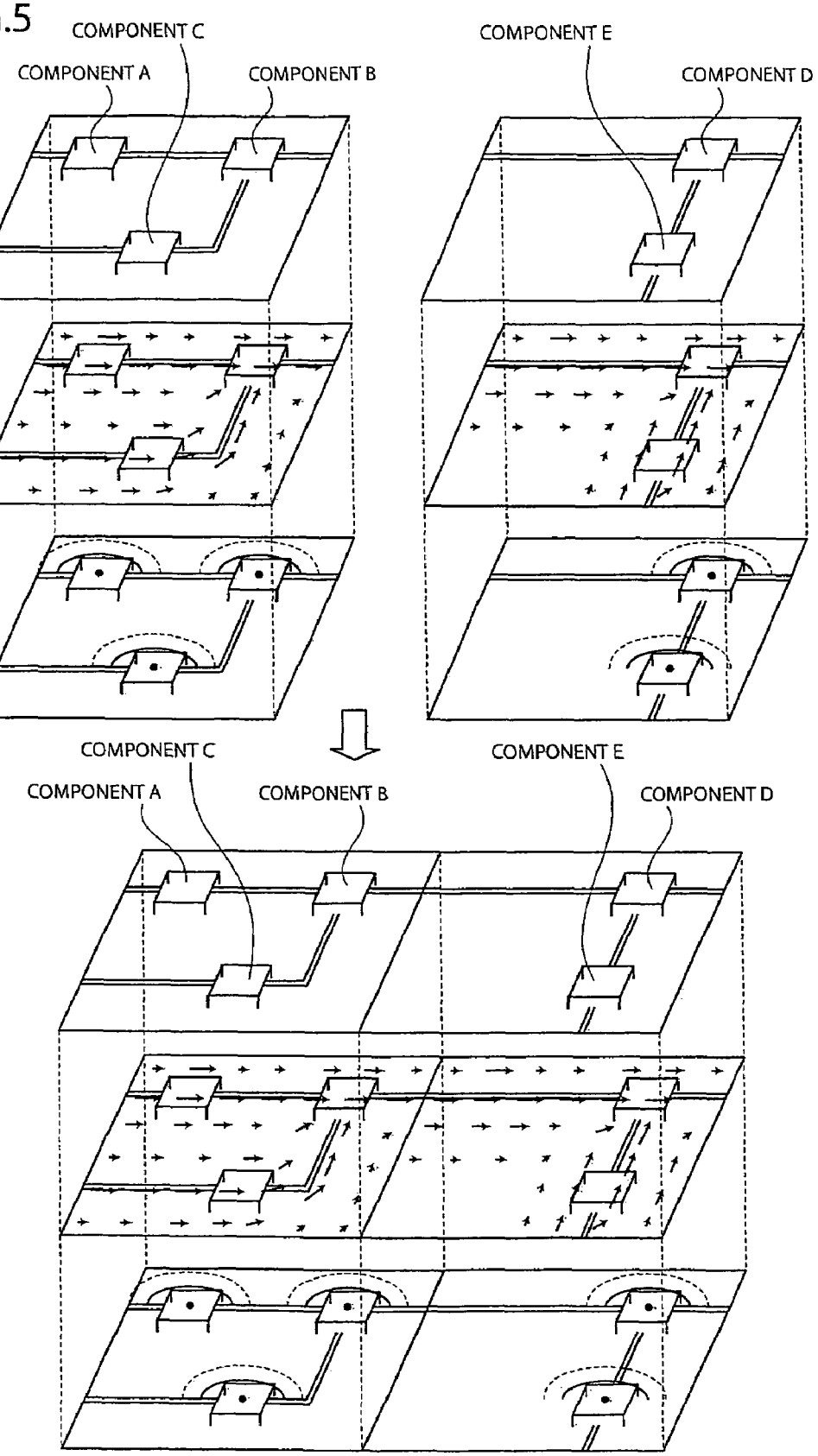
FIG. 5 is an explanatory view schematically illustrating coupling of electromagnetic field analysis models in accordance with generation of a wiring board layout of the present invention.

FIG. 5 is an explanatory view schematically illustrating the coupling of the electromagnetic field analysis models 14 in accordance with the generation of the wiring board layout by module coupling. As shown in the figure, simultaneously with the generation of wiring board layout by the coupling of the modules 11, the corresponding electromagnetic field analysis models 14 of the modules are coupled to generate the coupled electromagnetic field analysis model.

Figure 11:
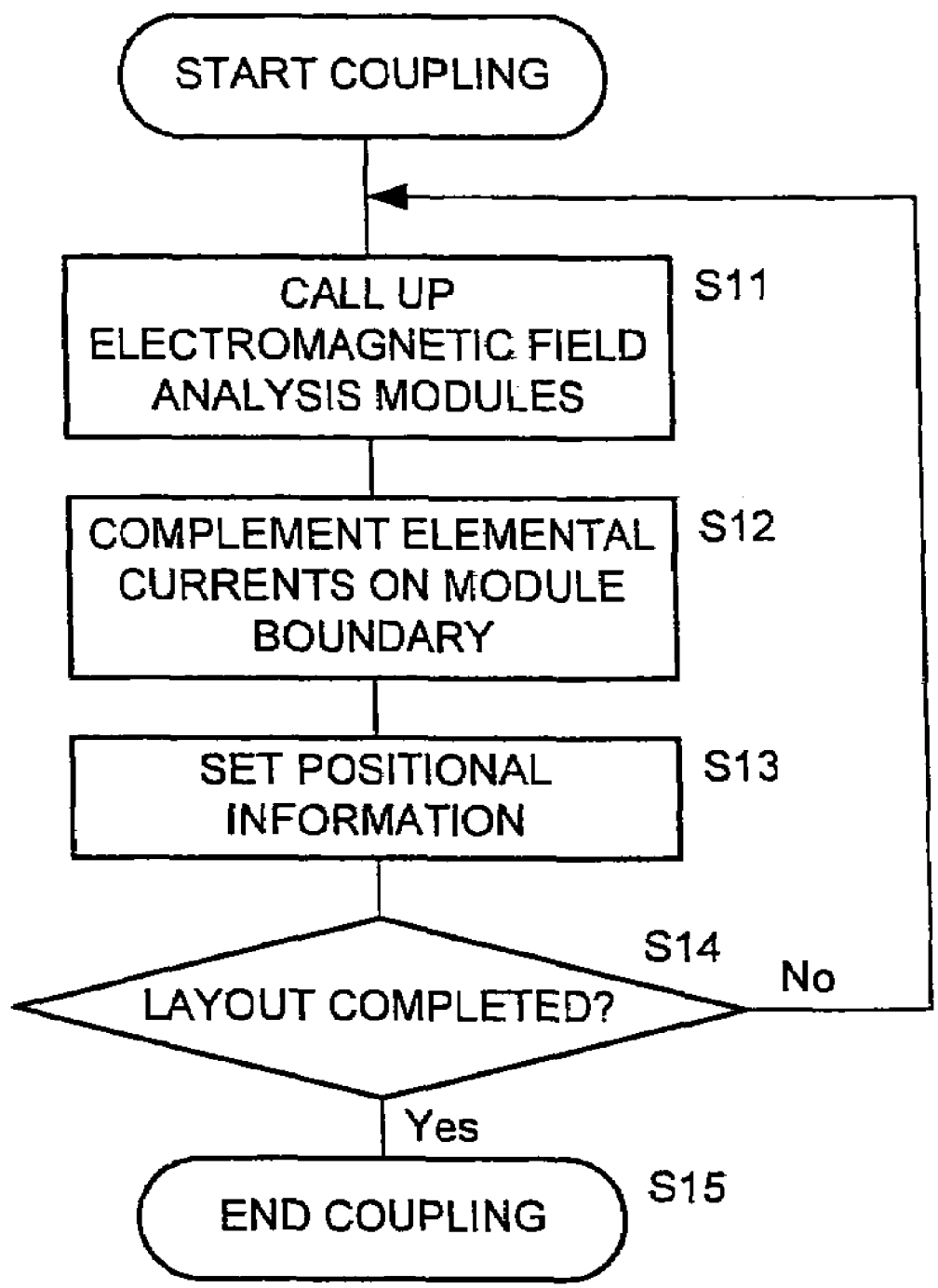
FIG. 11 is a flowchart of the operations performed by an electromagnetic field analysis model coupling section 5 of FIG. 1.

FIG. 11 is a flowchart illustrating the operations performed by the electromagnetic field analysis model coupling section 5.

When it is designated at the input section 2 which module 11 is to be newly added and where it is to be positioned, the electromagnetic field analysis model coupling section 5 starts operating in parallel with the layout generation section 4. In Step S11, the electromagnetic field analysis models 14 that correspond to the modules 11 designated at the input section 2 are called up, and in Step S12, the elemental currents on the boundary between the modules 11 are complemented by the elemental currents in the modules adjacent to the boundary. In Step S13, setting of the positional information is executed.

In the module 11 that is designated first, a datum point is provided at a given position and the positions of the elemental currents and radiation points are respectively determined from the electromagnetic field analysis model 14. Every time another module 11 is added thereafter, the positional information of the respective elemental currents and radiation points in the electromagnetic field analysis model 14 corresponding to the added module 11 is determined. In step S14, it is determined whether or not the layout has been completed. This determination is made by the user at the input section 2. If the layout is not completed, the operations from Steps S11 to S13 are repeated in accordance with the module 111 that is to be newly added. After the completion of the operations, the generation of the coupled electromagnetic field analysis model is completed in Step S15 and data is sent to the electromagnetic field analysis section 6.

Figure 6:
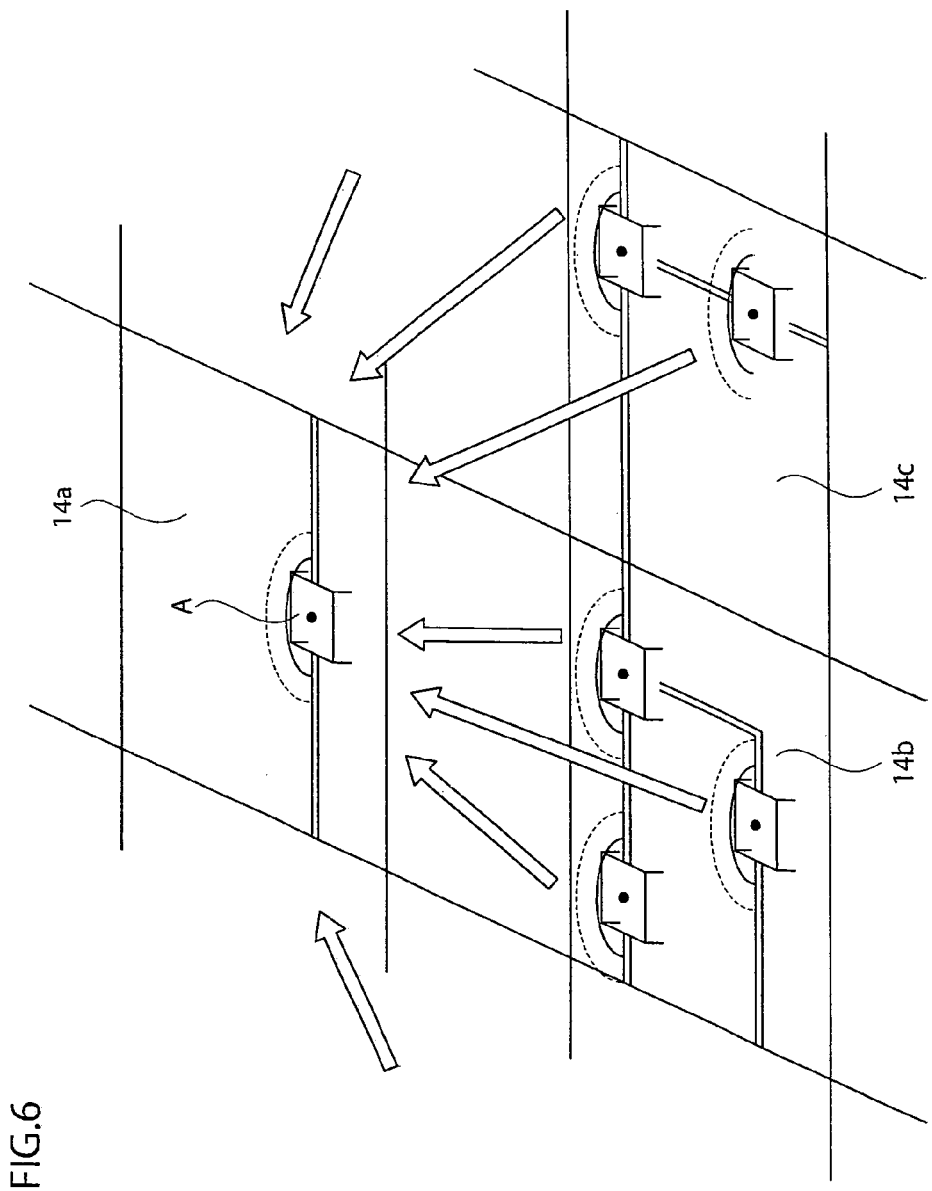

The electromagnetic field analysis section 6 uses the coupled electromagnetic field analysis model coupled by the electromagnetic field analysis model coupling section 5 to calculate the electromagnetic field at a given point and evaluates the effect of electromagnetic coupling.

ore specifically, such operations as described below, for example, are performed. When it is assumed that a given module is a target module, the amount of radiation that the module receives from another module coupled thereto is calculated. FIG. 6 is an explanatory view illustrating how a electromagnetic field analysis model 14a corresponding to an unillustrated module 11a is influenced by being electromagnetically coupled with electromagnetic field analysis models 14b, 14c . . . and so on corresponding to modules 11b, 11c . . . and so on. An element A in the model 14a is electromagnetically influenced not only by the module it corresponds to but also by the other models 14b, 14c and so on. The amount of influence of radiation is calculated not by simply adding the amount of radiation from the models 14a, 14b, 14c and so on as a scalar amount, but by vector computation in view of the positional relationship of the radiation points on the respective electromagnetic field analysis models 14. In other words, the effect of radiation that the element A receives from its surroundings is determined by adding three-dimensional vectors of the radiation from the respective radiation points on the electromagnetic field analysis model. Where the respective radiation points have a certain phase correlation and more accurate analysis results can be obtained by calculation in view of the phase relationship, the effect of radiation can be determined by allowing the numerical values of the electromagnetic field analysis model to include an entry of phase factor p (where $0<p<=0$) and multiplying the factors.

Figure 12:
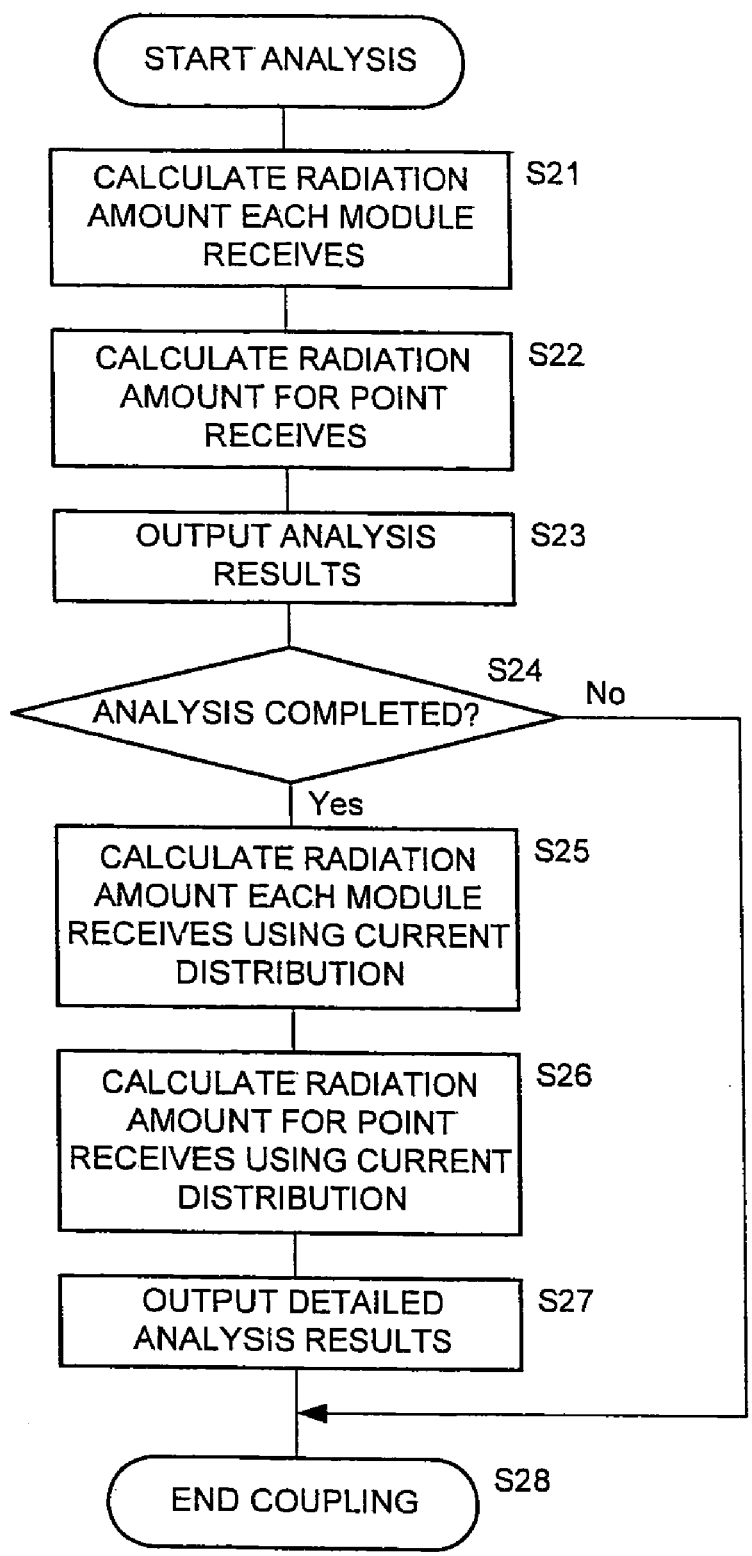
FIG. 12 is a flowchart of the operations performed by an electromagnetic field analysis section 6 of FIG. 1.

FIG. 12 is a flowchart of the operations performed by the electromagnetic field analysis section 6. In Step S21, the amount of radiation that each module 11 receives from the other modules 11 is calculated from data of the electromagnetic field analysis models 14 of the other modules and the positional information obtained at the electromagnetic field analysis model coupling section 5. In Step S22, the radiation amounts of points in regions far from the radiation points of each module are calculated. The designation of the far regions is made by a user. Where a sphere of 3-m radius is designated, for example, the radiation amounts of points on the circumference of the sphere are calculated. In Step S23, data on the analysis results obtained so far is sent to the electromagnetic field analysis result output section 7. In Step S24, it is decided whether the analysis is to be finished. Where the user needs simple analysis only, the analysis finishes and where the user needs more detailed analysis, the analysis continues. Even when the analysis is continued, the results of the simple analysis can be consulted while the detailed analysis proceeds. Where the analysis is continued, the radiation amount that each module receives is calculated in Step S25 using the current distribution model in the electromagnetic field analysis model 14, and in Step S26, the radiation amount that a point receives is calculated using the current distribution model. The results of these calculations are sent to the electromagnetic field analysis result output section 7 in Step S27 and the analysis is completed in Step S28.

When analyzing the radiation amount of the wiring board, the radiation amount that a given point located away from the wiring board receives from each radiation point is determined using the radiation characteristics of all radiation points included in the electromagnetic field analysis models 14a, 14b, 14c and so on which are coupled, and vector addition of all of the radiation points is performed so that the radiation amount of the entire wiring board is calculated.

Alternatively, the electromagnetic field at a given point can be determined by using the current distribution model. In this case, the current distribution in each module is divided into small meshed regions and the effect of electromagnetic fields guided to the element A from an elemental current in each region is determined. Then, the electromagnetic effect from each of the meshed regions is determined by vector addition. By using the current distribution model, the electromagnetic effect particularly from regions close in distance can be accurately determined. However, the current distribution model usually requires more time for computation than the radiation point model since it has a number of meshed regions.

The amount of influence of radiation may also be determined by finding the effects of the electromagnetic waves that the element A receives from the distant modules 11a, 11b and so on and then calculating the effect from the nearby module, for example, the module on which the element A is located using the current distribution model to superimpose these effects. Alternatively, the effects from a plurality of nearby modules may be calculated using the current distribution model.

By doing so, the effects from the nearby modules can be accurately determined and the effects from the distant modules can be determined with adequate accuracy by simple computation.

The analysis results obtained at the electromagnetic field analysis section 6 are converted into data in the form outputtable to the output section 20 at the electromagnetic field analysis result output section 7 and is sent to the output section 20 so that the results of the radiation characteristic analysis are displayed or printed.

Next, the heat distribution analysis model 15 will be described below in greater detail and an explanation will be given on the flow of procedure from the generation of the coupled heat distribution analysis model, in which the heat distribution analysis models 15 are coupled, to the obtainment of the results of heat distribution analysis based on the generated analysis model.

Figure 7B:
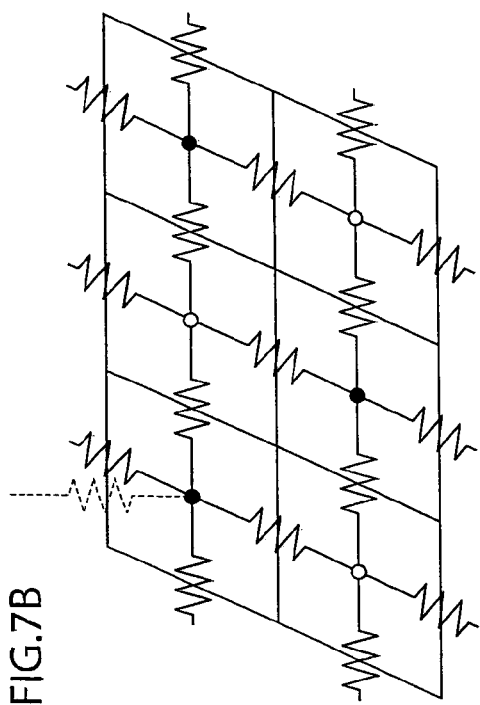
FIG. 7A is an explanatory view of components mounted on a wiring board module of the present invention and FIGS. 7B-7D are explanatory views of heat distribution analysis models corresponding to the module.
Figure 7D:
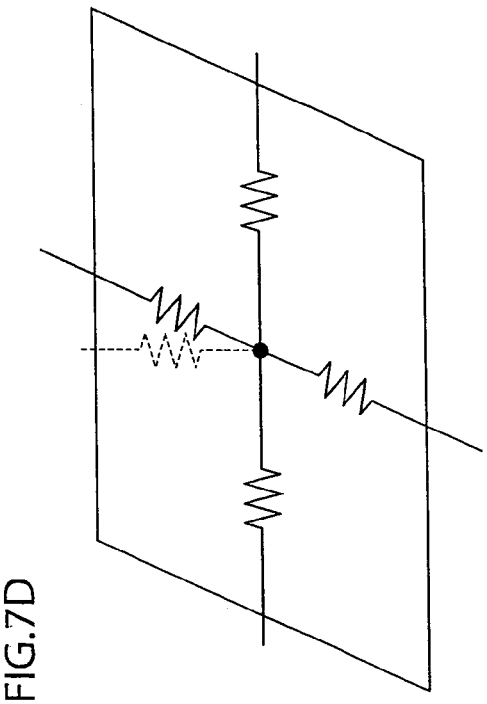
Figure 7A:
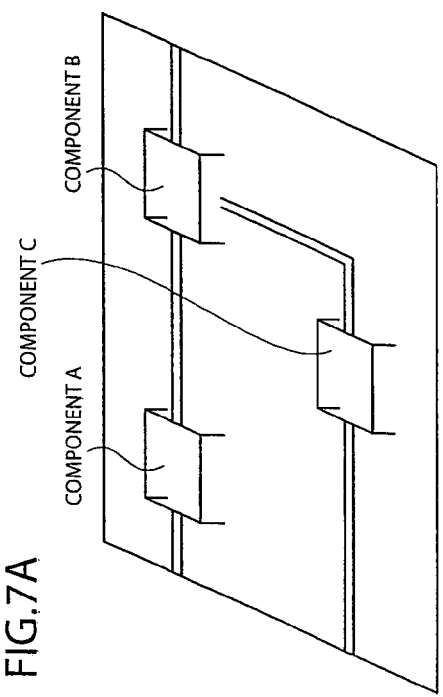
Figure 7C:
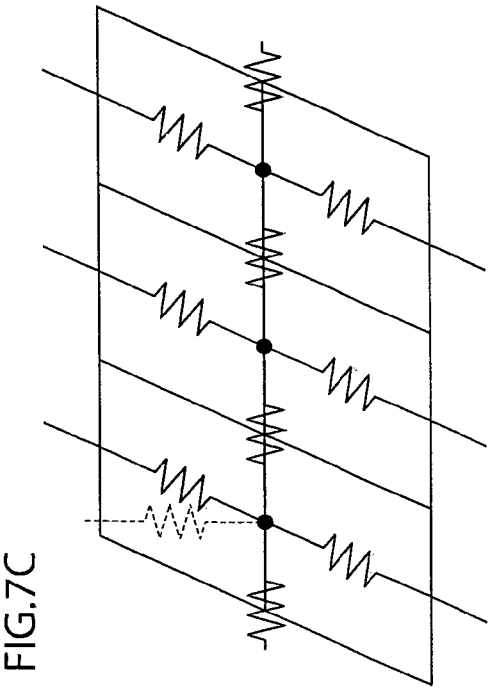

FIG. 7A is an explanatory view of components mounted on the wiring board module 11 and FIGS. 7B-7D are explanatory views of heat distribution analysis models 15 corresponding to the module 11. FIG. 7A shows the layout pattern and the on-board components of the module 11. FIGS. 7B to 7D show models for the heat distribution analysis. Each of the models is constituted of an equivalent network having a plurality of nodes, a heat source connected to one of the nodes and a plurality of heat resistors connected between the nodes or between the nodes and the outside. Among these models, the model of FIG. 7B is the most detailed one. The heat resistor shown by the dotted line is the one which indicates radiation to the atmosphere. In the figure, though only one node is shown to have the resistor emitting to the atmosphere as a representative of other nodes, the nodes actually have their respective resistors emitting to the atmosphere. The nodes at the positions where the components are located each have the heat quantity of the component located thereon generated when the module 11 is operated. FIG. 7C is a slightly simplified version of the model of FIG. 7B. The heat distribution analysis model of FIG. 7D is the most simplified one and includes a node having the heat quantity and heat resistors in various directions. The heat distribution analysis model 15 may include several types of models from the detailed one to the most simplified one. The heat distribution analysis model 15 may only include two types of models of the detailed one and the simplified one without having an intermediate model such as the one of FIG. 7C. The designer only needs to consider which model to choose among the models of different simplification levels and does not need special knowledge on the simplification. Alternatively, the heat distribution analysis model may only include one of the above models.

FIG. 8 is an explanatory view illustrating one example of a data table that stores the heat distribution analysis models as numerical data. The modules 11 each include as the heat distribution analysis model the heat quantity and heat resistance expressed in numerals as shown in the figure. As shown in FIG. 8, the heat distribution analysis model includes a plurality of analysis models which are different in simplification level. Each analysis model is constituted of a plurality of nodes and a plurality of heat resistors. For each node, information on the position and heat generation thereof are stored. The heat quantity of the node where a heating element is not positioned is 0. For each heat resistor, information on the nodes to which each resistor is connected and the resistance are stored. The heat resistor indicating the emission of heat to the outside, that is, to the air has one end thereof connected to the outside.

Figure 9:
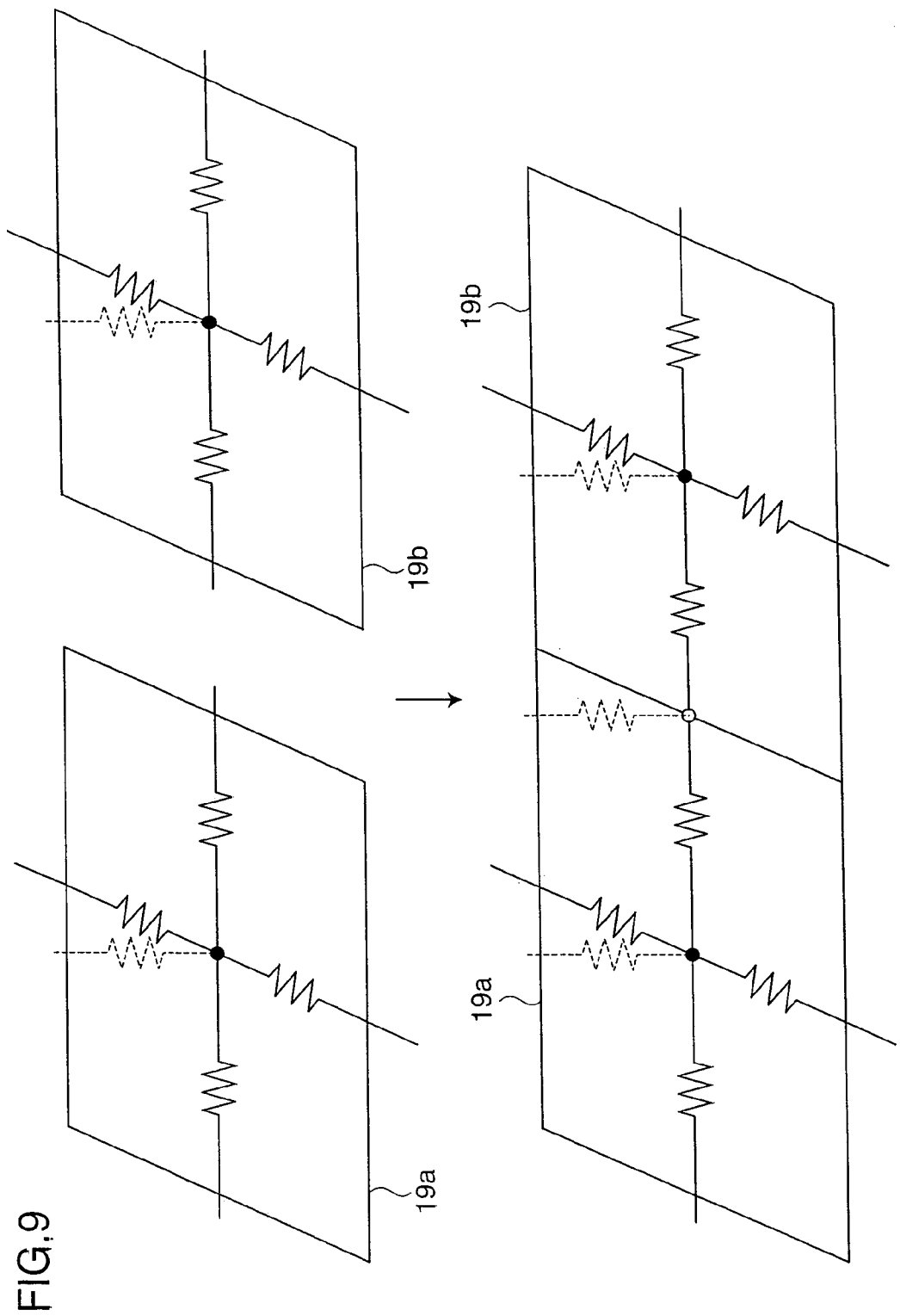
FIG. 9 is an explanatory view schematically illustrating coupling of heat distribution analysis models in accordance with generation of a wiring board layout of the present invention.

Connecting of the heat distribution analysis models 15 is executed at the heat distribution analysis model coupling section 8. Since the connecting of the models 15 corresponds with the module coupling at the layout generation section 4, the module coupling section 3 can generate the coupled heat distribution analysis model at the same time as the generation of a wiring board layout. FIG. 9 is an explanatory view schematically illustrating the coupling of the heat-distribution analysis models in accordance with the generation of a wiring board layout by module coupling. As shown in FIG. 9, a node is provided between the modules 11 which are connected and the modules 11 are connected via the node. Though in the figure, the coupling of the simplified heat distribution analysis models 15 is illustrated, it is preferable that the layout designer can select the simplification level of the heat distribution analysis model 15 of each module.

Figure 10:
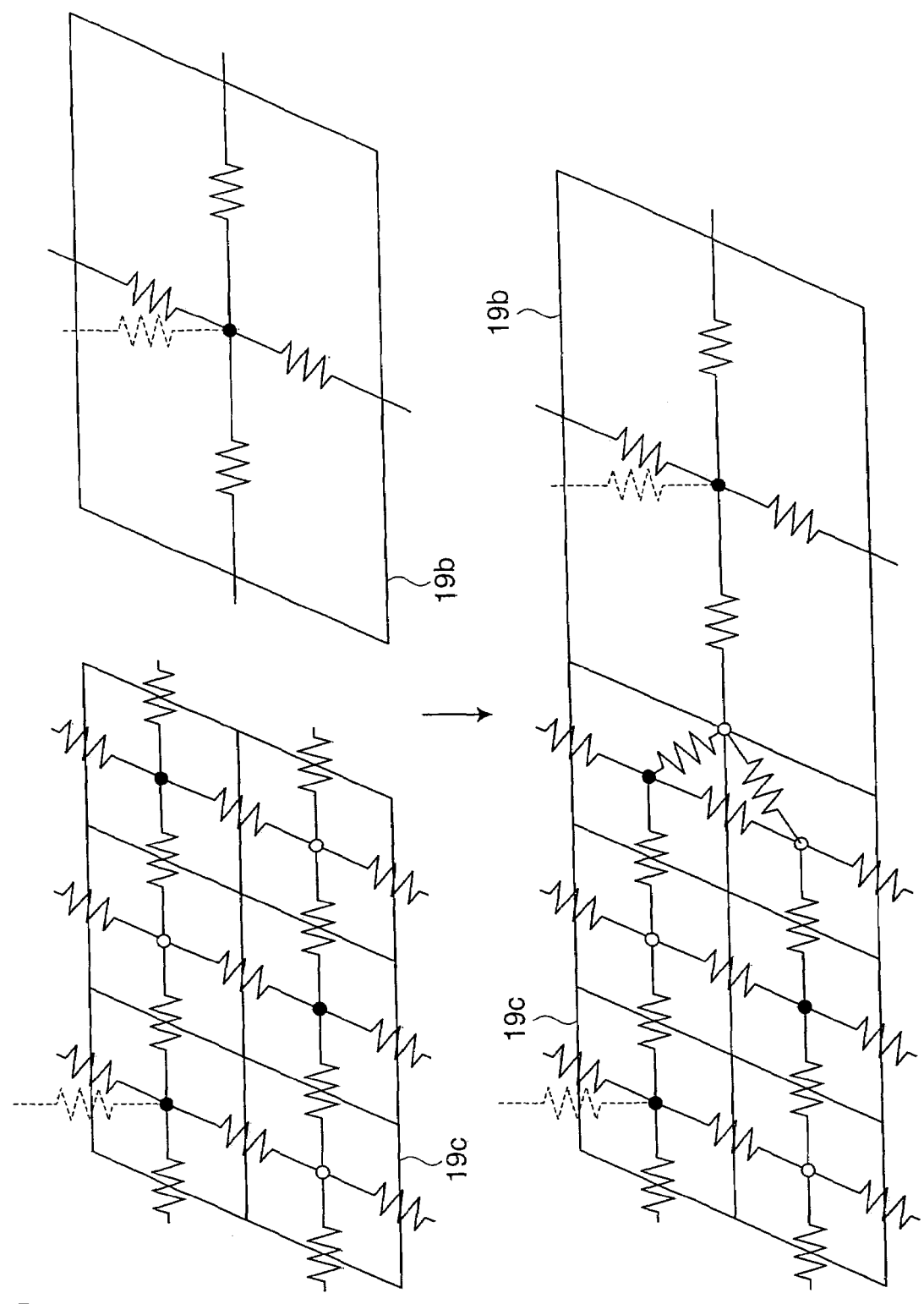
FIG. 10 is an explanatory view illustrating coupling of heat distribution analysis models which are different in simplification level from each other in the present invention.

FIG. 10 is an explanatory view illustrating the coupling of heat-distribution analysis models which are different in simplification level from one another. In FIG. 10, the one on the left side is the detailed heat distribution analysis model 15 and the one on the right side is the simplified heat distribution analysis model 15 which are coupled together. In this coupling, a node is provided between the modules 11 as in the case of coupling the simplified heat distribution analysis models 15, and one of the resistors of the respective models are connected to the node. By connecting the heat distribution analysis models different in simplification level over the entire wiring board, a thermal equivalent circuit which is necessary for the heat distribution analysis of the wiring board is produced to provide the coupled heat distribution analysis model.

Figure 13:
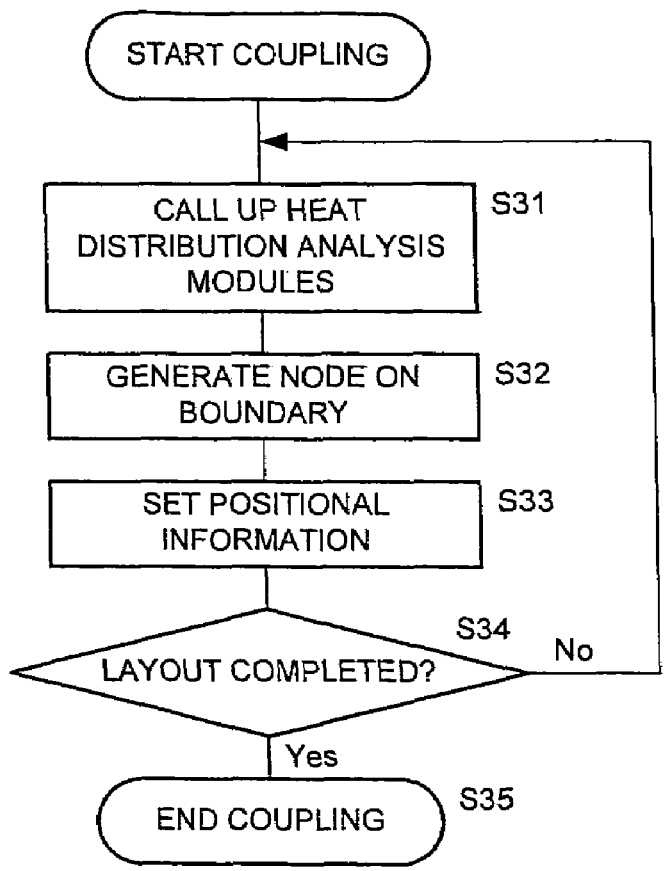
FIG. 13 is a flowchart of the operations performed by a heat distribution analysis model coupling section 8 of FIG. 1.

FIG. 13 is a flowchart of the operations performed by the heat distribution analysis model coupling section 8.

When it is designated at the input section 2 which modules 11 are to be newly added and where they are to be positioned, the heat distribution analysis model coupling section 8 starts operating in parallel with the layout generation section 4. In Step S31, the heat distribution analysis models 15 that correspond to the modules 11 designated at the input section 2 are called up, and in Step S32, a node is provided on the boundary between the heat distribution analysis models to be coupled and connected with the heat resistors on the models. In Step S33, setting of the positional information is performed.

A datum point is provided at a given position in the module 11 which is designated first and the positions of the nodes on the coupled heat distribution analysis model are determined from the positional information on the nodes included in the heat distribution analysis model 15. Every time another module 11 is added thereafter, the positions of the nodes on the heat distribution analysis model 15 corresponding to the added module 11 and the position of the node complemented on the boundary are determined. In step S34, it is determined whether or not the layout has been completed. This determination is made by the user at the input section 2. If the layout is not completed, the operations from Steps S31 to S33 are repeated in accordance with the module 11 that is designated to be newly added at the input section 2. After the completion of the operations, the generation of the coupled electromagnetic field analysis model is completed in Step S35 and data is sent to the heat distribution analysis section 9.

The heat distribution analysis section 9 performs the heat distribution analysis based on the thermal equivalent circuit of the obtained coupled heat distribution analysis model. In other words, a simultaneous equation is formulated from the thermal equivalent circuit given from the coupled heat distribution analysis model and the equation is solved so that the heat quantity of each node in the wiring board (corresponding to the voltage of each node in the equivalent circuit) originating from the heat generated at a given node in a given module (corresponding to the voltage of the equivalent circuit) can be calculated.

After the heat quantity of each node in the wiring board is calculated for the heat generated at each of the nodes in a given module, the same calculations are performed for the rest of the modules 11 of the wiring board. The results of the calculations are superimposed to obtain the heat quantity of each node by the heat generation of all of the nodes in the wiring board. Thus, the heat quantity of each node in the entire wiring board can be obtained.

Since it is assumed that the heat distribution of a given module is greatly influenced by the heat sources in regions near the module, a method that uses this property to achieve both high analysis accuracy and less computation can be considered. In other words, when analyzing the heat distribution of a given module, the most detailed heat distribution analysis model may be used for the target module and the simplified heat distribution analysis model may be used for the rest of the modules to determine the heat quantity of each node. Alternatively, the simplified analysis model may be used for all of the modules to determine the heat quantity of each node, and then, the target module may be subjected to recalculation using the most detailed heat distribution analysis model, with the heat quantity of each node connected to the other modules being the boundary condition, to determine the ultimate heat distribution in the modules. A plurality of nearby modules may be converted into the detailed heat distribution analysis model. The choice of which method to use can be appropriately made according to the analysis accuracy required, the scale of the wiring board and the computation ability of the apparatus.

Figure 14:
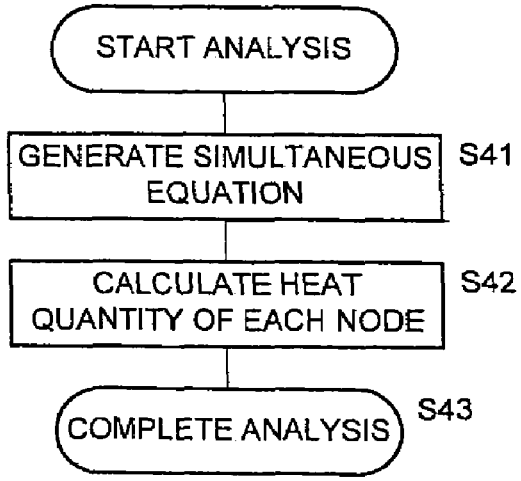
FIG. 14 is a flowchart of the operations performed by a heat distribution analysis section 9 of FIG. 1.

FIG. 14 is a flowchart of the operations performed by the heat distribution analysis section 9. In Step S41, simultaneous equations are prepared from the thermal equivalent circuit obtained from the coupled heat distribution analysis model. In Step S42, the equations are solved and the heat quantity of each node is calculated. In Step S43, the analysis is completed and the results are sent to the heat distribution analysis result output section 10.

The analysis results thus obtained at the heat distribution analysis section 9 are converted into data in the form outputtable to the output section 20 at the heat distribution analysis result output section 10 and is sent to the output section 20 so that the heat distribution characteristics of the entire wiring board are displayed or printed. Even if the detailed analysis model is used for the analysis of all of the modules 11, the analysis time is significantly reduced since the heat quantity and heat resistance prepared in advance are used and there is no need for preparing the analysis model starting from the calculation of the heat resistance and heat quantity.

The designer judges from the thus obtained electromagnetic field analysis and heat distribution analysis results whether the present layout of the wiring board has accomplished target standards and whether the layout has fine characteristics or some kind of problems. Where the analysis results do not satisfy the target standards, the wiring board layout is changed and data is inputted again from the input section 2 based on the changes made to the design. The designing and analysis are repeated and the designing is completed when there is no problem in analysis results.

As described hereinabove, the electromagnetic field analysis model and heat distribution analysis model which are analyzed in advance in the modules are reused to perform the electromagnetic field analysis and heat distribution analysis of the entire wiring board. This allows the analysis time to be significantly reduced and the designer can make small design changes while checking the analysis results.

In the aforementioned embodiments, the electromagnetic field analysis and heat distribution analysis are illustrated as exemplary embodiments of the characteristic analysis using the analysis model prepared for each module. However, it should be understood that the essence of the present invention is not limited to these types of analyses and the present invention is applicable to waveform analysis and other types of analyses. It should also be understood that the embodiments of the analysis models are not limited to those described in the aforementioned embodiments.

The invention thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A layout designing/characteristic analyzing apparatus for a wiring board, the apparatus comprising:
    a module library memory for storing in advance for each of wiring board modules which are constituents of the wiring board, moduled circuit information on moduled circuits which constitute a wiring board circuit, wiring information and an analysis model for use in characteristic analysis;
    an input section for inputting instructions on connection of the moduled circuits so as to construct a desired circuit;
    a module coupling section for connecting moduled circuits based on the inputted instructions, for determining a layout of the wiring board based on the wiring information of each module and for generating a coupled analysis model in which the analysis models of the modules are coupled;

a characteristic analyzing section for analyzing the characteristics of the wiring board based on the generated coupled analysis model; and an output section for outputting the determined layout and the results of the characteristic analysis of the wiring board.

2. An apparatus according to claim 1, wherein the module library memory stores an electromagnetic field analysis model as the analysis model, the module coupling section generates a coupled electromagnetic field analysis model as the coupled analysis model and the characteristic analyzing section performs electromagnetic field analysis based on the coupled electromagnetic field analysis model.

3. An apparatus according to claim 2, wherein the electromagnetic field analysis model includes either one or both of a current distribution model and a radiation point model, the current distribution model being represented by elemental currents in divided regions of each module and the radiation point model being represented by points of imaginary radiation sources located on each module.

4. A layout designing/characteristic analyzing apparatus for a wiring board, the apparatus comprising:

a module library memory for storing in advance for each of wiring board modules which are constituents of the wiring board, moduled circuit information on moduled circuits which constitute a wiring board circuit, wiring information and an electromagnetic field analysis model, the electromagnetic field analysis model including either one of or both of a current distribution model represented by elemental currents in divided regions of each module and a radiation point model represented by points of imaginary radiation sources located in each module;

an input section for inputting instructions on connection of the moduled circuits so as to construct a desired circuit;

a module coupling section for connecting the moduled circuits based on the inputted instructions, for determining a layout of the wiring board based on the wiring information of each module and for generating a coupled electromagnetic field analysis model in which the field analysis models of the modules are coupled;

a characteristic analyzing section for analyzing the electromagnetic field characteristics of the wiring board based on the generated coupled electromagnetic field analysis model; and an output section for outputting the determined layout and the results of the electromagnetic field characteristic analysis of the wiring board.

5. An apparatus according to claim 4, wherein the characteristic analyzing section calculates the strength of an electromagnetic field that an observation point receives from each module based on the electromagnetic field analysis model and combines the calculated strengths of electromagnetic fields to determine the strength of electromagnetic fields that the observation point receives from the wiring board.

6. An apparatus according to claim 5, wherein the characteristic analyzing section determines the strength of electromagnetic fields that the observation point receives from the wiring board based on the result of calculation of electromagnetic fields in predetermined coupled modules using the radiation point model and the result of calculation of electromagnetic fields in other predetermined coupled modules using the current distribution model.

7. An apparatus according to claim 1, wherein the module library memory stores a heat distribution analysis model as the analysis model, the module coupling section outputs a coupled heat distribution analysis model as the coupled analysis model and the characteristic analyzing section performs heat distribution characteristic analysis based on the coupled heat distribution analysis model.

8. An apparatus according to claim 7, wherein the heat distribution analysis model comprises an equivalent network having a plurality of nodes, a heat source having a predetermined heat quantity connected to one of the nodes and a plurality of heat resistors each having a predetermined resistance connected between the nodes.

9. An apparatus according to claim 8, wherein the heat distribution analysis model includes a plurality of heat distribution analysis models at different simplification levels.

10. A layout designing/characteristic analyzing apparatus for a wiring board, the apparatus comprising:

a module library memory for storing in advance for each of wiring board modules which are constituents of the wiring board, moduled circuit information on moduled circuits which constitute a wiring board circuit, wiring information and a heat distribution analysis model, the heat distribution analysis model comprising an equivalent network having a plurality of nodes, a heat source having a predetermined heat quantity connected to one of the nodes and a plurality of heat resistors each having a predetermined resistance connected between the nodes;

an input section for inputting instructions on connection of the moduled circuits so as to construct a desired circuit;

a module coupling section for connecting the moduled circuits based on the inputted instructions, for determining a layout of the wiring board based on the wiring information of each module and for generating a coupled heat distribution analysis model in which the heat distribution analysis models of the modules are coupled;

a characteristic analyzing section for analyzing the heat distribution characteristics of the laid-out wiring board based on the generated coupled heat distribution analysis model; and an output section for outputting the determined layout and the results of the heat distribution characteristic analysis of the wiring board.

11. An apparatus according to claim 10, wherein the module coupling section couples the heat distribution analysis models which are different in simplification level from one module to another to form a thermal equivalent circuit.

12. An apparatus according to claim 7, wherein the characteristic analyzing section calculates the thermal effects that an observation point receives from the respective modules and combines these effects to determine the thermal effect that the observation point receives from the wiring board.

13. An apparatus according to claim 12, wherein the characteristic analyzing section determines the thermal effect that the observation point receives from the wiring board based on the result of calculation of the thermal effect that the observation point receives from the wiring board using the coupled heat distribution analysis model in which the heat distribution analysis models at a predetermined simplification level are coupled and the result of calculation of the thermal effect in predetermined coupled modules using the heat distribution analysis model at a lower simplification level.

* * * * *